US009041326B2

(12) United States Patent
Gunselmann et al.

(10) Patent No.: US 9,041,326 B2
(45) Date of Patent: May 26, 2015

(54) METHOD FOR OPERATING A BRUSHLESS ELECTRIC MOTOR

(75) Inventors: Christian Gunselmann, Wuppertal (DE); Mathias Fernengel, Dietzenbach (DE); Nicolas Bruyant, Villeneuve Tolosane (FR); Lionel Guichard, Toulouse (FR); Michel Parette, Fonsorbes (FR)

(73) Assignee: Continental Automotive GmbH (DE)

( * ) Notice: Subject to any disclaimer, the term of this patent is extended or adjusted under 35 U.S.C. 154(b) by 278 days.

(21) Appl. No.: 13/634,039

(22) PCT Filed: Mar. 23, 2011

(86) PCT No.: PCT/EP2011/054477
§ 371 (c)(1),
(2), (4) Date: Oct. 19, 2012

(87) PCT Pub. No.: WO2011/117311
PCT Pub. Date: Sep. 29, 2011

(65) Prior Publication Data
US 2013/0193885 A1 Aug. 1, 2013

(30) Foreign Application Priority Data
Mar. 23, 2010 (DE) .......................... 10 2010 003 149

(51) Int. Cl.
*H02H 7/08* (2006.01)
*H02P 6/14* (2006.01)
(Continued)

(52) U.S. Cl.
CPC ............... *H02P 6/14* (2013.01); *B62D 5/0484* (2013.01); *B62D 5/0487* (2013.01); *H02P 29/022* (2013.01); *H02P 6/085* (2013.01); *G01R 31/42* (2013.01)

(58) Field of Classification Search
USPC ............... 318/801, 490, 139, 400.21, 400.04, 318/478, 721, 724; 361/23, 30, 88, 1, 100, 361/20, 71, 87, 63, 93.1, 93.2; 700/79; 324/73.1; 327/365, 124
See application file for complete search history.

(56) References Cited

U.S. PATENT DOCUMENTS 4,126,061 A * 11/1978 Fry ................................ 340/441
5,099,408 A * 3/1992 Chen et al. ...................... 363/41
(Continued)

FOREIGN PATENT DOCUMENTS

DE 102 49 568 A1 5/2004
DE 10 2010 000 852 A1 7/2010
(Continued)

OTHER PUBLICATIONS

International Search Report for PCT Application No. PCT/EP2011/054477 mailed May 29, 2012.

*Primary Examiner* — Rita Leykin
(74) *Attorney, Agent, or Firm* — RatnerPrestia

(57) ABSTRACT

A method for operating a brushless electric motor, the windings being energized by an inverter with the aid of six switches. A detection unit for detecting defective switches, a unit for measuring voltage at the outputs of the inverter, and a microcontroller for controlling the switch and for generating a pulse width modulated voltage supply for the windings are provided. A short-circuited switch causes a torque in the electric motor opposite the actuating direction of the electric motor. The method proposes that after detecting a short-circuited switch, the windings (U. V. W) are energized to generate a motor torque that is, on the whole, positive. An actuating period of the electric motor is divided into a plurality of sectors, wherein, in accordance with the defective switch, individual sectors are deactivated for the actuation of the windings (U, V, W), while other sectors are used to actuate the windings (V, W).

7 Claims, 4 Drawing Sheets

(51) Int. Cl.
  *B62D 5/04*   (2006.01)
  *H02P 29/02*  (2006.01)
  *H02P 6/08*   (2006.01)
  *G01R 31/42*  (2006.01)

(56) References Cited

U.S. PATENT DOCUMENTS

| | | | |
|---|---|---|---|
| 5,436,819 A * | 7/1995 | Mikami et al. | 363/41 |
| 5,874,818 A * | 2/1999 | Schuurman | 318/400.04 |
| 6,153,993 A * | 11/2000 | Oomura et al. | 318/434 |
| 6,441,556 B1 * | 8/2002 | Scruggs et al. | 315/127 |
| 6,653,812 B1 | 11/2003 | Huo et al. | |
| 7,161,323 B2 * | 1/2007 | Ajima et al. | 318/629 |
| 7,723,938 B2 * | 5/2010 | Tsuji et al. | 318/432 |
| 7,990,093 B2 * | 8/2011 | Kezobo et al. | 318/432 |
| 8,232,752 B2 * | 7/2012 | Kezobo et al. | 318/400.06 |
| 2005/0093505 A1 * | 5/2005 | Kameya | 318/805 |
| 2011/0285334 A1 | 11/2011 | Donner et al. | |
| 2012/0086372 A1 | 4/2012 | Henke et al. | |

FOREIGN PATENT DOCUMENTS

| | | | | |
|---|---|---|---|---|
| DE | 10 2010 001 241 A1 | 10/2010 | | |
| DE | 10 2009 045 351 A1 | 4/2011 | | |
| EP | 2 009 782 A1 | 12/2008 | | |
| JP | 2005153570 | * | 6/2005 | B62D 5/04 |
| JP | EP-2009782 | * | 4/2006 | H02P 21/04 |

* cited by examiner

METHOD FOR OPERATING A BRUSHLESS ELECTRIC MOTOR

CROSS REFERENCE TO RELATED APPLICATIONS

This application is the U.S. National Phase Application of PCT/EP2011/054477, filed Mar. 23, 2011, which claims priority to German Patent Application No. 10 2010 003 149.6, filed Mar. 23, 2010, the contents of such applications being incorporated by reference herein.

FIELD OF THE INVENTION

The present invention relates to a method for operating a brushless electric motor, the windings of which are actuated by an inverter by means of six switches, wherein an identification unit is provided for identifying defective switches, a unit is provided for voltage measurement at the outputs of the inverter and a microcontroller is provided for controlling the switches and for generating a pulse-width-modulated power supply for the windings.

BACKGROUND

DE 10 2010 000 852 A1, which is incorporated by reference, discloses a method for locating a defective switch and for determining the nature of the defect. The previously known method detects whether the defective switch is defectively switched on or switched off.

Inverters for actuating brushless motors generally consist of six switches. After a defect, each switch can have in principle two different characteristics: switched off, that is to say blocked in the open switch position, or switched on, that is to say blocked in the closed switch position. A defectively switched-on switch is also commonly referred to as a short circuit. A defectively switched-on switch causes a torque in the electric motor counter to the direction of operation of the electric motor. In particular in safety-relevant applications, it is then important to continue to operate the electric motor in an emergency mode.

BRIEF DESCRIPTION

The problem addressed by the present invention is therefore to provide a method for operating a brushless electric motor in which the effects of a defective switch are at least partially compensated.

This problem is solved by a method wherein after a defectively switched-on switch is identified, the windings (U, V, W) are actuated in such a way that a motor moment which is positive on average is generated. In this respect, it is provided that, after a defectively switched-on switch has been identified, the windings are actuated in such a way that a motor moment which is positive on average is generated.

In accordance with a development of the method according to an aspect of the invention, an actuation period of the electric motor is subdivided into a plurality of sectors, wherein, depending on the defective switch, individual sectors for actuating the windings are deactivated, while the other sectors are used to actuate the windings. In a specific embodiment, the actuation period is subdivided into twelve sectors, wherein each sector corresponds to 30°.

A further advantageous development provides that the windings are actuated in those sectors in which the defectively switched-on switch is also closed in the normal mode.

In addition, it is provided that voltage values, which counteract the effects of the defective switch, are applied to the windings in the sectors, which are used for the actuation.

The switches are combined into switch pairs and it is provided that a switch pair is no longer actuated when a switch of a switch pair is defectively switched on.

The following method steps are provided according to the method:
 identifying a defective switch;
 analyzing whether the defective switch is defectively switched on or switched off; and
 actuating the windings sector-by-sector.

The electric motor is switched off after a previously defined time period or once a safe external state is present.

BRIEF DESCRIPTION OF THE DRAWINGS

The invention will be explained in more detail in the following text with reference to one exemplary embodiment in conjunction with the attached drawing, in which.

DETAILED DESCRIPTION OF THE PREFERRED EMBODIMENTS

Figure 1:
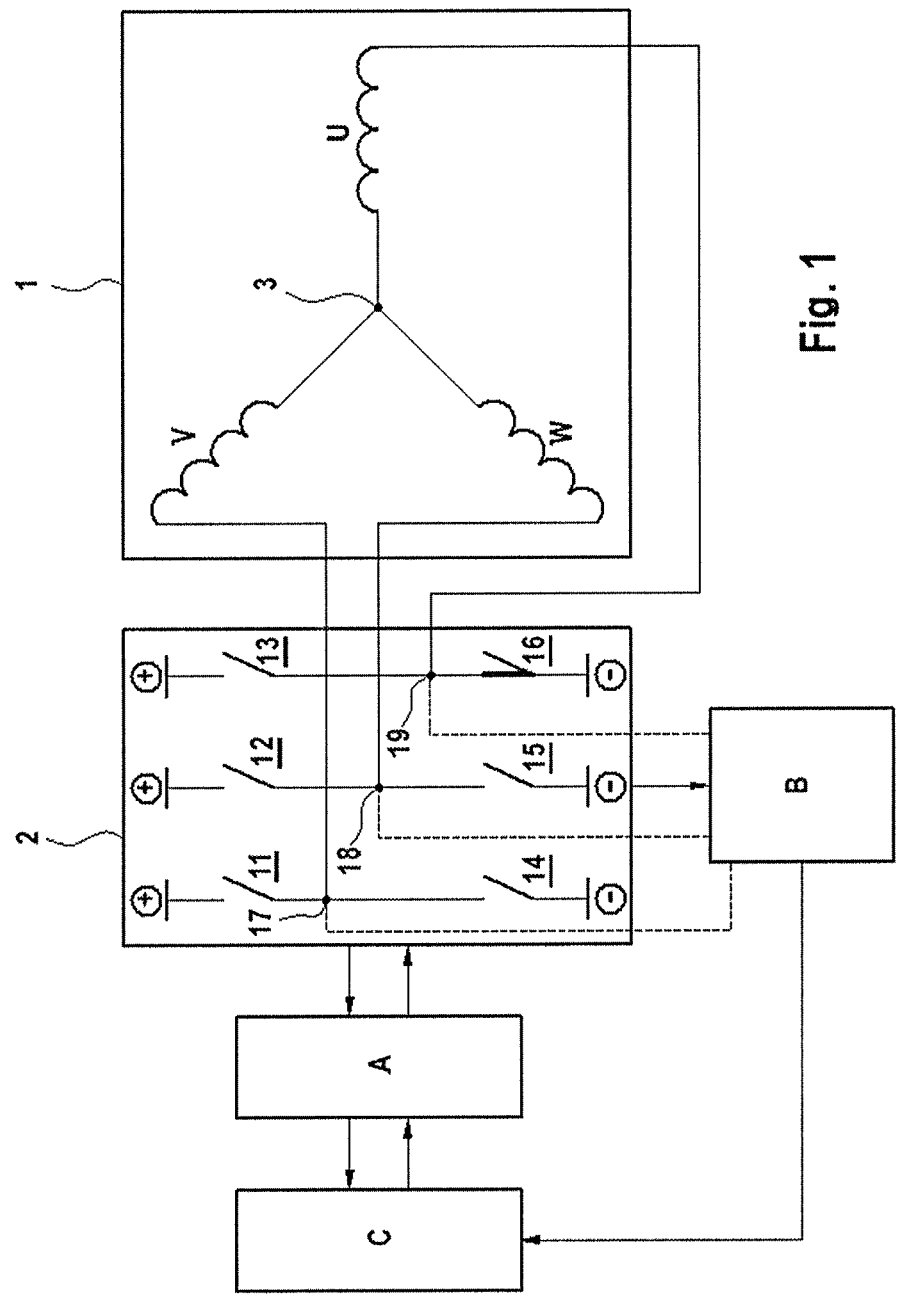
FIG. 1 shows a schematic outline illustration of the windings of a brushless electric motor and an inverter on which the method according to the invention can be carried out.

FIG. 1 schematically illustrates a brushless electric motor 1 of an electromechanical steering device, the windings U, V, W of which motor are actuated by an inverter 2. For this purpose, the inverter 2 has six switches 11, 12, 13, 14, 15, 16, wherein the upper switches 11, 12, 13 in FIG. 1 are associated with the positive supply voltage and the lower switches 14, 15, 16 in FIG. 1 are associated with the negative supply voltage. By way of example, the switches 11 and 14 therefore supply the winding V with a suitable supply voltage. The windings U, V, W are actuated by means of pulse-width-modulated voltage values $PWM_U$, $PWM_V$, $PWM_W$ which are predefined by a microcontroller C. As can also be seen from FIG. 1, there are tapping points 17, 18, 19 between the switches 11, 12, 13 associated with the positive supply voltage and the switches 14, 15, 16 associated with the negative supply voltage, at which tapping points the voltage across the windings U, V, W is tapped off and supplied to a unit B for voltage measurement. The measurement results from the unit B for voltage measurement are supplied to the microcontroller C which, on the one hand, controls the switches 11, 12, 13, 14, 15, 16 and, on the other hand, evaluates the information produced by the voltage measurement unit B. In addition, an identification unit A is provided, for identifying defective switches 11, 12, 13, 14, 15, 16. The information produced by identification unit A is likewise supplied to the microcontroller C, for evaluation.

In one embodiment, in practice, the switches 11, 12, 13, 14, 15, 16 are formed from semiconductor switches, more precisely transistors or MOSFETs. In practice, the identification unit A is formed as a bridge driver and applies a voltage across the switches 11, 12, 13, 14, 15, 16, which are formed as transistors, and checks whether the switch position of the transistor changes. In practice, the unit B for voltage measurement at the tapping points 17, 18, 19 is formed as a voltage divider and determines the duty cycle of a pulse-width-modulated voltage. In this case, the duty cycle corresponds to the quotient of the pulse duration and the period duration.

Each switch 11, 12, 13, 14, 15, 16 can have in principle two different types of defect, that is to say, after a defect, it is in principle in one of the two states described below: defectively switched off, that is to say blocked in the open switch position, or defectively switched on, that is to say blocked in the closed switch position. A defectively switched-on switch 11, 12, 13, 14, 15, 16 is also commonly referred to as a short circuit. Since a defectively switched-on switch 11, 12, 13, 14, 15, 16 is essentially critical to the operation of the electromechanical steering device, this fault event is assumed in the following text. In the present exemplary embodiment in accordance with FIG. 1, the switch 16, which is associated with the winding U, is illustrated as defectively switched on.

In particular in safety-relevant applications, such as in an electromechanical steering device, it is important to react very quickly in order to transfer the electric motor 1 into an emergency mode. The fault event of the defectively switched-on switch leads to an increased steering moment since the vehicle operator moves the electric motor 1 in the generator mode in the event of a fault and in doing so induces a current which directly counteracts the steering movement at the steering wheel. This moment, which counteracts the direction of rotation by the vehicle operator, is referred to as braking moment in the following text. A braking moment dependent on the rotational speed is produced in a permanently excited synchronous machine by means of the short circuit in the inverter 2. By means of the defectively switched-on switch 16 and the body diodes of the switches 14, 15, a power connection occurs by induction via the motor windings U, V, W.

Figure 2:
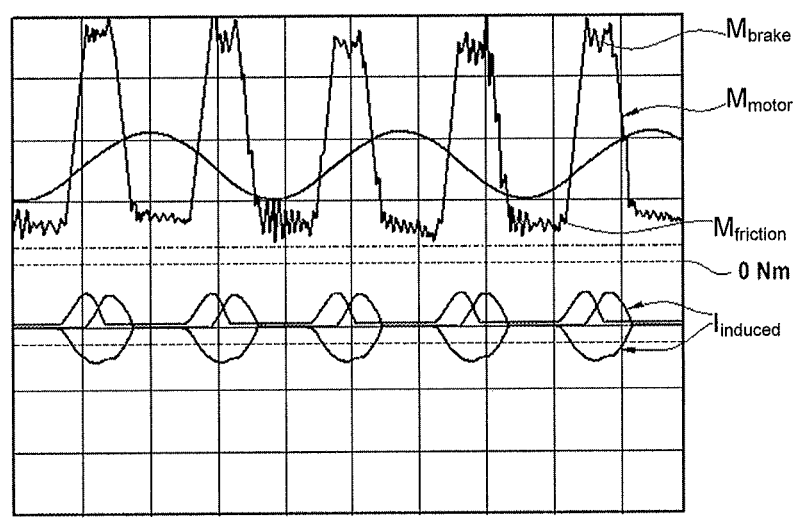
FIG. 2 shows a graph with measurement values for clarifying the effects of a defectively switched-on switch.

FIG. 2 shows a graph with measurement values, which was recorded at an electric motor 1 having a defectively switched-on switch 16. The sinusoidal curve represents the different motor phases of the rotating electric motor 1. One actuation period is $2\pi$ or 360°. The lower part of the graph of FIG. 2 shows the induced currents $I_{induced}$ in the three motor windings U, V, W. The upper half shows the torque $M_{motor}$ of the electric motor 1. The induced currents $I_{induced}$ cause the motor moment $M_{motor}$ to reach a value $M_{brake}$ in an angular range of approximately 180°. At the same time, it can also be seen that the motor moment $M_{motor}$ in the angular ranges, in which no currents are induced, does not fall to 0 Nm, rather it retains a residual level, $M_{friction}$. The induced current $I_{induced}$ only flows in a restricted angular range of approximately 180°. In the remaining angular range the electric motor 1 is deenergized and no disturbing braking moment acts.

Even if the actuation of the electric motor 1 were stopped, the problem would not be solved in the case of an electromechanical steering device: by means of the rotation of the steering wheel, the vehicle operator would constantly induce new currents $I_{induced}$ which counteract his rotation of the steering wheel. It is therefore not expedient to switch off the actuation of the electric motor 1. However, the continued actuation of the electric motor 1 in the normal mode when this fault occurs can generate extremely high motor currents which can lead to further instances of destruction in the system. It is therefore imperative to avoid continued actuation in the normal mode despite the defectively switched-on switch 16.

The solution of opening a safety switch in the event of a defectively switched-on switch 16, in order to remove the short circuit caused by a switch 16 blocked in the switched-on state, is known from the prior art. Such a safety switch is arranged, for example, at the star point 3 of the windings U, V, W and is also referred to as star-point relay. By opening a safety switch, the increased steering effort on the part of the vehicle operator is reduced. However, the vehicle operator still does not receive any more steering assistance from the electric motor 1.

Figure 3:
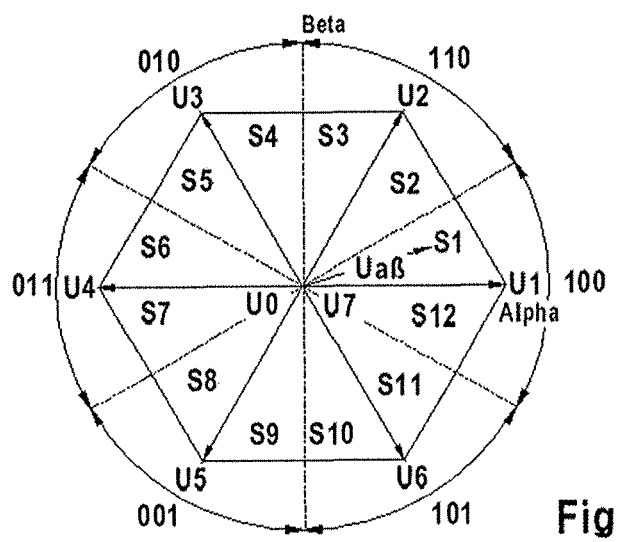
FIG. 3 shows a schematic diagram of an actuation period of the electric motor.

In contrast, the method described here provides that the opening of the star point 3 is dispensed with and that the electric motor 1 continues to operate in an emergency mode. For this purpose, it is provided that, after a defectively switched-on switch 16 is identified, the windings U, V, W are actuated in such a way that a motor moment which is positive on average is produced. For this, as shown in FIG. 3, an actuation period of the electric motor 1 is subdivided into twelve sectors S1 to S12 of 30° in each case. Depending on which of the switches 11, 12, 13, 14, 15, 16 is defectively switched on, individual sectors are deactivated while the other sectors are used to actuate the windings U, V, W. In the case described here, the lower switch 16 of the winding U is defectively switched on and four sectors S1, S2, S11, S12 for actuating the windings U, V, W are deactivated, while the other eight sectors S3 to S10 are used to actuate the windings U, V, W. The passive sectors S1, S2, S11, S12 are not used for actuation since actuating the windings U, V, W in these sectors would further increase the braking effect of the braking moment acting counter to the intended direction of operation of the electric motor 1. In principle, those sectors in which the defective switch would also be switched on, that is to say closed, in the normal mode of the electric motor 1 are active. In the exemplary embodiment described here, those are the sectors S3 to S10 in the left half-plane. This can be seen from the initial zeroes in the labels 010, 011 and 001, where the first digit represents winding U and a zero means that the lower switch 16 is switched-on, that is to say it is closed. In addition, the two sectors S10 and S3 which are directly adjacent in each case are used to actuate the windings.

In principle, the two switches 13, 16 of the switch pair with a defect are no longer actuated. The remaining four switches 11, 12, 14, 15 of the switch pairs 11, 14; 12, 15 are actuated in the eight active sectors S3 to S10 according to a previously defined scheme. The actuation scheme is dependent on the direction of rotation of the electric motor 1. In this case, the actuation scheme can be changed depending on the operating state of the system, for instance vehicle speed, steering-wheel angle, rotational speed of the vehicle drive motor and the on-board power supply voltage. Within an active sector S3 to S10, defined voltage values are applied across the windings V and W via the switches of the inverter 2.

Figure 4:
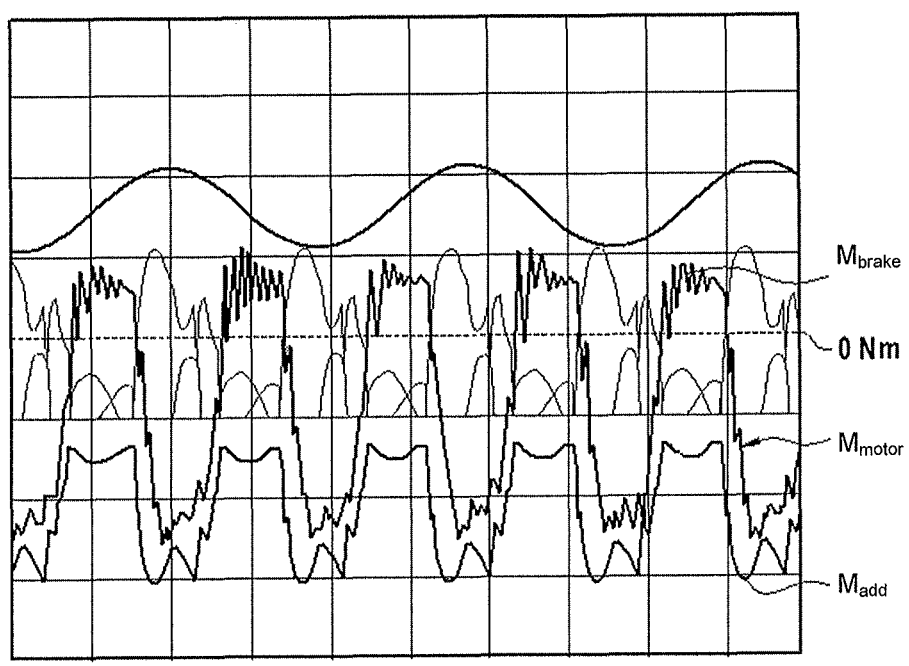
FIG. 4 shows a graph, corresponding to FIG. 2, taking into account the present method.

FIG. 4 shows the effect of this sector-by-sector actuation of the windings U, V, W. Again, the sinusoidal curve shows the motor rotation. The negative motor moment $M_{brake}$ is compensated by the additional supporting motor moment $M_{add}$, which is obtained by the actuation in the active sectors S3 to S10, to such an extent that the motor moment $M_{motor}$ is positive overall. By way of explanation, it is noted that the positive average motor moment $M_{motor}$ shown in the graph of FIG. 4 is represented by negative values in this case. As soon as the motor vehicle is transferred into a safe state, the electric motor 1 is deactivated.

Figure 5:
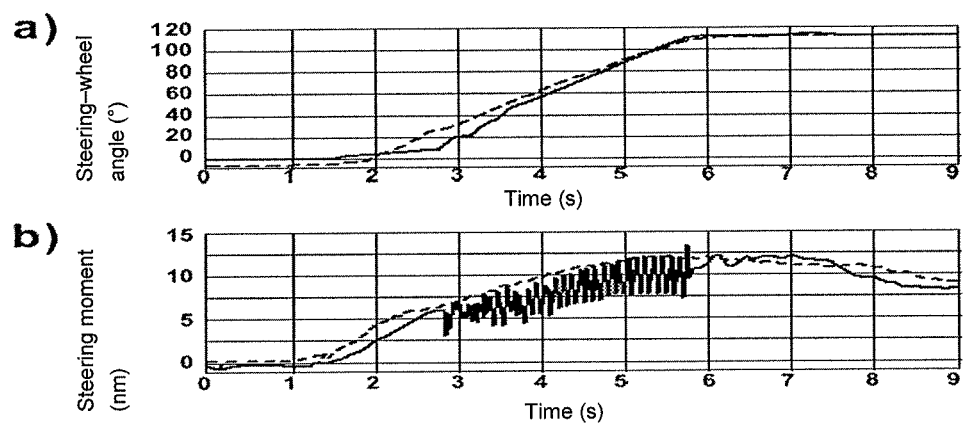
FIG. 5a, b show an illustration of a steering-wheel angle and a steering moment of an electromechanical steering system in which the present method is used.
Figure 6:
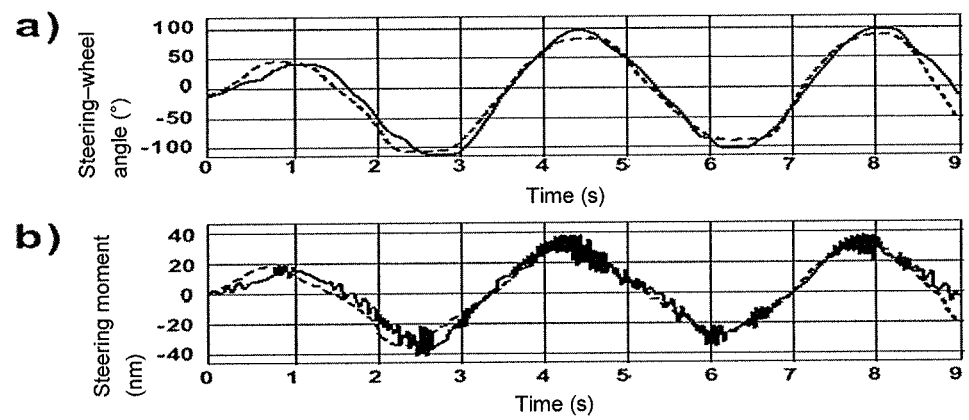
FIG. 6a, b show a graph, corresponding to FIGS. 5a, b, in the event of another steering maneuver.

The described method is compared to the solution disclosed in the prior art of opening the star point 3, with reference to FIG. 5a, b and FIGS. 6a, b. FIGS. 5a and 6a show in each case the steering-wheel angle which is applied to the steering wheel by the vehicle operator, while FIGS. 5b and 6b show the steering moment. In all the figures, time is represented on the X-axis. The dashed line represents the steering-wheel angle or the steering moment when the star point 3 is open, while the continuous line represents the same values in accordance with the above-described method. As a fault, the lower switch 16 of the winding U is again assumed to be defectively switched on.

The steering maneuver shown in FIG. 5a, b corresponds to steering on a circular track at a vehicle speed of 10 km/h and a radius of 20 m. It can be seen from FIG. 5a that in both cases the vehicle operator steers at approximately the same speed on the circular track. FIG. 5b shows the steering moment experienced by the vehicle operator at the steering wheel. Here, the dashed line is the steering moment in the event of an open star point 3. It can clearly be seen that the steering moment which is represented by the continuous line and which is realized in accordance with the method described here experiences significant support from the electric motor 1. Despite the interior braking moment, a positive motor moment is achieved by means of the described control.

FIG. 6a, b show the steering-wheel angle and the steering moment in the event of a slalom movement of the motor vehicle. As can be seen in FIG. 6a, the vehicle operator turns the steering wheel approximately 100° to the left and approximately 100° to the right during this slalom movement. The steering moment when the star point is open, shown in FIG. 6b with the dashed line (red), is more regular than the steering moment experienced by the vehicle operator in the case of the method described here. Both steering moments are approximately equal in size. After a previously defined time period, or once a safe external state is present, the electric motor 1 is switched off.

As has become evident from FIGS. 5a, b and 6a, b, it is possible to dispense with a relay at the star point 3 and the fault of a defectively switched-on switch can be compensated purely with actuation measures. This means that it is possible to dispense with electronic components such as the star-point relay.

The invention claimed is:

1. A method for operating a brushless electric motor, the windings (U, V, W) of which are actuated by an inverter by six switches, wherein an identification unit is provided for identifying defective switches, a unit is provided for voltage measurement at the outputs of the inverter and a microcontroller is provided for controlling the switches and for generating a pulse-width-modulated power supply ($PWM_U$, $PWM_V$, $PWM_W$) for the windings (U, V, W), wherein, after a defectively switched-on switch is identified, the windings (U, V, W) are actuated in such a way that a motor moment which is positive on average is generated, wherein an actuation period of the electric motor is subdivided into a plurality of sectors, wherein, depending on the defective switch, individual sectors for actuating the windings (U, V, W) are deactivated, while the other sectors are used to actuate the windings (V, W).

2. The method as claimed in claim 1, wherein the actuation period is subdivided into twelve sectors, wherein each sector corresponds to 30°.

3. The method as claimed in claim 1, wherein the windings (V, W) are actuated in those sectors in which the defectively switched-on switch is also closed in a normal mode.

4. The method as claimed in claim 1, wherein voltage values ($PWM_V$, $PWM_W$), which counteract the effects of the defective switch, are applied to the windings (V, W) in the sectors, which are used for the actuation.

5. The method as claimed in claim 1, wherein the switches are combined into switch pairs, and a switch pair is no longer actuated when a switch of a switch pair is defectively switched on.

6. The method as claimed in claim 1, further comprising:
   identifying a defective switch;
   analyzing whether the defective switch is defectively switched on or switched off; and
   actuating the windings (U, V, W) sector-by-sector.

7. The method as claimed in claim 6, wherein the electric motor is switched off after a previously defined time period or once a safe external state is present.

* * * * *